(12) United States Patent
Wippler

(10) Patent No.: US 11,310,946 B2
(45) Date of Patent: Apr. 19, 2022

(54) AUTOMOTIVE WIRELESS CHARGER WITH SELF TEMPERATURE MANAGEMENT

(71) Applicant: Toyota Motor Engineering & Manufacturing North America, Inc., Plano, TX (US)

(72) Inventor: Erik A. Wippler, Canton, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 165 days.

(21) Appl. No.: 16/788,162

(22) Filed: Feb. 11, 2020

(65) Prior Publication Data
US 2021/0251109 A1    Aug. 12, 2021

(51) Int. Cl.
| | | |
|---|---|---|
| *H05K 7/20* | (2006.01) | |
| *H02J 7/02* | (2016.01) | |
| *H01L 35/28* | (2006.01) | |
| *H02J 7/00* | (2006.01) | |

(52) U.S. Cl.
CPC ......... *H05K 7/20945* (2013.01); *H01L 35/28* (2013.01); *H02J 7/0047* (2013.01); *H02J 7/02* (2013.01); *H05K 7/20845* (2013.01)

(58) Field of Classification Search
USPC ........................................................ 320/108
See application file for complete search history.

(56) References Cited

U.S. PATENT DOCUMENTS

| | | |
|---|---|---|
| 6,282,906 B1 | 9/2001 | Cauchy |
| 6,732,534 B2 | 5/2004 | Spry |
| 8,826,830 B2 | 9/2014 | Pajic |
| 8,947,047 B2 | 2/2015 | Partovi et al. |
| 9,356,466 B2 | 5/2016 | Han et al. |
| 9,604,565 B2 | 3/2017 | Prasad et al. |
| 9,698,623 B2 | 7/2017 | Adams et al. |
| 10,219,407 B2 | 2/2019 | Lofy et al. |
| 10,286,862 B2 | 5/2019 | Pkie et al. |
| 10,334,752 B2 | 6/2019 | Shin et al. |
| 2007/0152633 A1 | 7/2007 | Lee |

(Continued)

FOREIGN PATENT DOCUMENTS

| | | |
|---|---|---|
| DE | 102018201300 A1 | 7/2017 |
| KR | 2017084567 A | 8/2019 |

OTHER PUBLICATIONS

Wikipedia, "Thermoelectric cooling", Jul. 2015, https://en.wikipedia.org/wiki/Thermoelectric_cooling.

*Primary Examiner* — Mohammed Alam
(74) *Attorney, Agent, or Firm* — Snell & Wilmer LLP

(57) ABSTRACT

Methods, systems, devices and apparatuses for a wireless charger for charging an electronic device within a vehicle. The wireless charger includes a first sensor. The first sensor is configured to measure or detect a temperature of the electronic device. The wireless charger includes a thermoelectric device. The thermoelectric device is configured to adjust the temperature of the electronic device or a surface of the charging pad. The wireless charger includes a processor coupled to the first sensor and the thermoelectric device. The processor is configured to determine that the temperature of the electronic device exceeds a first threshold temperature and control the thermoelectric device to increase or decrease the temperature of the electronic device or the surface of the charging pad.

20 Claims, 6 Drawing Sheets

(56) References Cited

U.S. PATENT DOCUMENTS

| | | | |
|---|---|---|---|
| 2008/0136364 A1* | 6/2008 | Calvarese | H01M 10/443 |
| | | | 320/101 |
| 2011/0056215 A1 | 3/2011 | Ham et al. | |
| 2016/0181849 A1* | 6/2016 | Govindaraj | H02J 7/0044 |
| | | | 320/108 |
| 2018/0224909 A1 | 8/2018 | Koo et al. | |
| 2021/0251109 A1* | 8/2021 | Wippler | H05K 7/20945 |
| 2021/0273476 A1* | 9/2021 | Wippler | H02J 50/80 |

\* cited by examiner

AUTOMOTIVE WIRELESS CHARGER WITH SELF TEMPERATURE MANAGEMENT

BACKGROUND

Field

This disclosure relates to a system, method, apparatus and/or device for temperature management of a charging pad.

Description of the Related Art

The demand for wireless charging in consumer products continues to increase. Current wireless chargers operate charge around 5 W at approximately 50% efficiency. Newer wireless devices, such as smartphones, however, are able to charge at much greater rates, such as approximately 10 W-15 W. When these newer wireless devices charge at these higher rates between approximately 10 W-15 W, the batteries of these wireless devices increase in temperature. Moreover, these wireless devices are sometimes left to rest in a charger tray or bin for upwards of 2 hours depending on the size and state of charge of the battery. Charging the wireless devices for this length of time can cause excessive heat buildup in the wireless charger and/or the wireless device. Additionally, charging at high (above 10 Watts) power levels speed up the charging but also cause the wireless device to overheat.

Consequently, some consumer products limit the rate of charge or deactivate charging altogether when the temperature reaches a threshold amount to prevent overheating and/or injury to the customer. This, however, decreases the efficiency of charging the consumer product, causes user dissatisfaction and increases the amount of time necessary to charge the consumer product.

Accordingly, there is a need for a system, apparatus and/or method to control the temperature of the device that is charging to increase the overall charging efficiency.

SUMMARY

In general, one aspect of the subject matter described in this disclosure may be embodied in a wireless charger for charging an electronic device within a vehicle. The wireless charger includes a first sensor. The first sensor is configured to measure or detect a temperature of the electronic device. The wireless charger includes a thermoelectric device. The thermoelectric device is configured to adjust the temperature of the electronic device or a surface of the charging pad. The wireless charger includes a processor coupled to the first sensor and the thermoelectric device. The processor is configured to determine that the temperature of the electronic device exceeds a first threshold temperature and control the thermoelectric device to increase or decrease the temperature of the electronic device or the surface of the charging pad.

These and other embodiments may optionally include one or more of the following features. The processor may be configured to determine that the temperature of the electronic device is greater than or equal to the first threshold temperature. The processor may be configured to decrease the temperature of the electronic device or the surface of the charging pad when the temperature of the electronic device is greater than or equal to the first threshold temperature. The processor may be configured to determine that the temperature of the electronic device is less than the first threshold temperature. The processor may be configured to increase the temperature of the electronic device or the surface of the charging pad when the temperature of the electronic device is less than the first threshold temperature.

The processor may be configured to decrease the temperature of the electronic device or the surface of the charging pad when the temperature of the electronic device is greater than or equal to the first threshold temperature. The processor may be configured to increase the temperature of the electronic device or the surface of the charging pad when the temperature of the electronic device is less than or equal to a second threshold temperature. The second threshold temperature may be less than the first threshold temperature.

The wireless charger may include a second sensor. The second sensor may be configured to measure or detect an ambient temperature within the vehicle. The processor may be configured to control the thermoelectric device to increase or decrease the temperature of the electronic device or the surface of the charging pad based on the ambient temperature and the temperature of the electronic device. The processor may be configured to control the thermoelectric device to increase or decrease the temperature of the electronic device or the surface of the charging pad until the temperature of the electronic device no longer exceeds the first threshold temperature.

In another aspect of the subject matter may be embodied in a charging apparatus. The charging apparatus includes a temperature sensor configured to measure or detect a temperature of an electronic device that is charging. The charging apparatus includes a thermoelectric device. The thermoelectric device is configured to adjust the temperature of the electronic device. The charging apparatus includes a processor coupled to the temperature sensor and the thermoelectric device. The processor is configured to determine that the temperature of the electronic device exceeds a temperature range. The processor is coupled to the thermoelectric device. The processor is configured to cause the thermoelectric device to increase the temperature of the electronic device when the temperature of the electronic device is below the temperature range. The processor is configured to cause the thermoelectric device to decrease the temperature of the electronic device when the temperature of the electronic device is above the temperature range.

In another aspect, the subject matter may be embodied in a method for adjusting a temperature of a charging device within a vehicle. The method includes measuring or detecting, by a temperature sensor, a temperature of the charging device. The method includes determining, by a processor, that the temperature of the charging device is greater than a first threshold temperature. The method includes decreasing, by the processor and using a thermoelectric device, the temperature of the charging device when the temperature of the charging device is greater than the first threshold temperature.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale and may be exaggerated to better illustrate the important features of the present invention.

DETAILED DESCRIPTION

Disclosed herein are systems, apparatuses, and methods for a charging apparatus, such as a wireless charging apparatus, in a vehicle with thermal management. The wireless charging system self-manages, controls or otherwise adjusts the temperature of the charging surface, e.g., a pad, tray or bin, to decrease, increase or otherwise manage the temperature of the user device, such as a wireless device, being charged. For example, the wireless charging system may decrease the temperature of the charging surface to decrease the temperature of wireless device being charged when the temperature of the wireless device greater than or equal to a threshold to cool the wireless device. By cooling the wireless device, the wireless charging system prevents the wireless device from overheating and more efficiently charges the wireless device.

Other benefits and advantages include the capability to increase the temperature of the charging surface to increase the temperature of the wireless device being charged when the temperature of the wireless device is less than or equal to a threshold to warm the wireless device. By warming the wireless device, the wireless device may more efficiently reach the optimal temperature and reach peak charging efficiency.

Additionally, the wireless charging system may determine the optimal temperature ranges for various wireless devices so that the wireless charging system may maintain a fairly constant temperature for a variety of different types of wireless devices that may be coupled to the wireless charging system to be charged. This improves the battery life of multiple various different types of wireless devices, improves energy efficiency, and improves customer satisfaction because the wireless device does not overheat and charges as quickly as possible.

Figure 1:
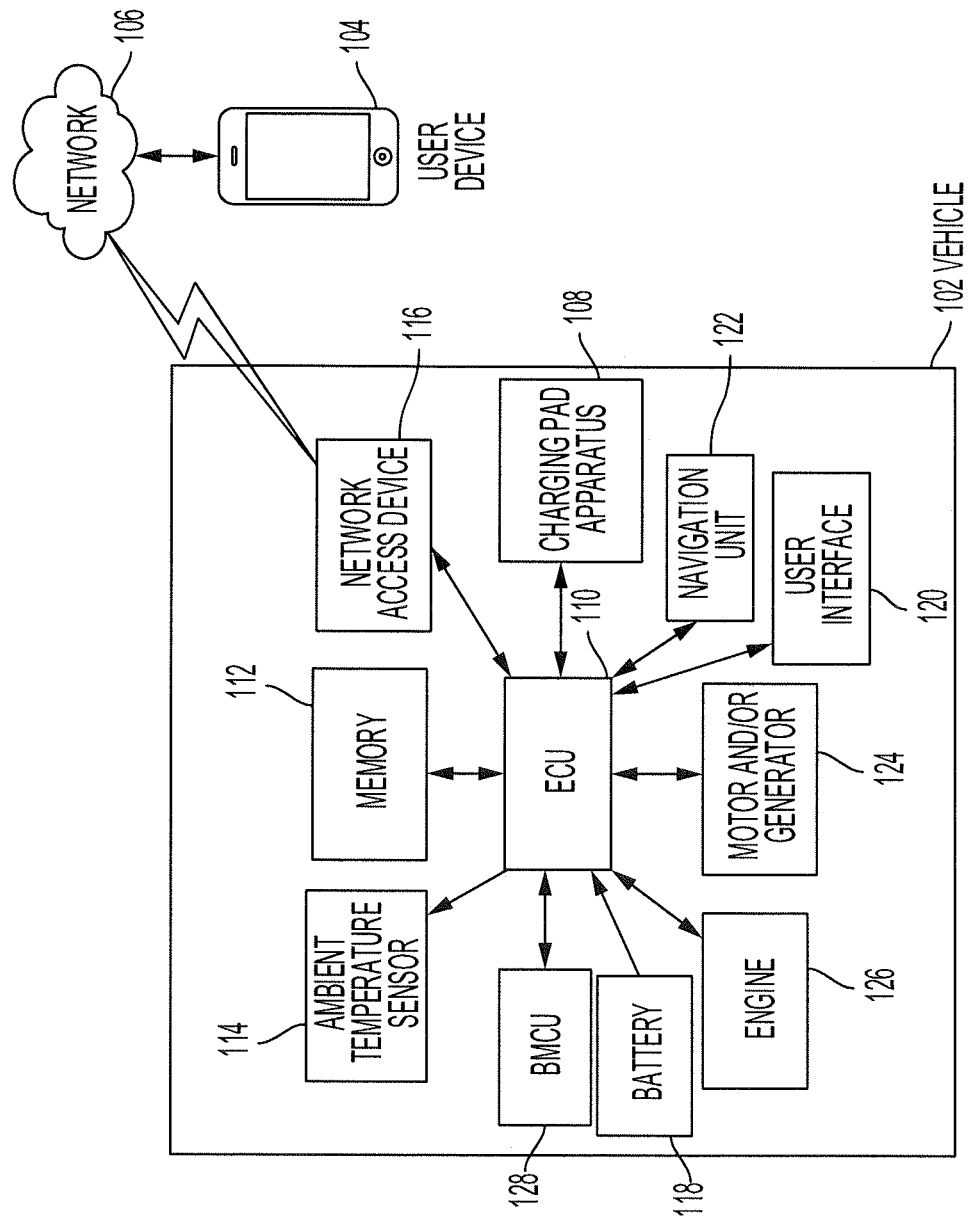
FIG. 1 is a block diagram of an example wireless charging system according to an aspect of the invention.

FIG. 1 is a block diagram of a wireless charging system 100. The wireless charging system 100 may be retro-fitted, coupled to, integrated with, include or be included within a vehicle 102 or may be entirely separate from the vehicle 102. The wireless charging system 100 may include or be coupled to a user device 104. The user device 104 may be a personal device, a mobile device, such as a smartphone, an audio/visual player or other electronic or wireless device that may be charged using the wireless charging system 100 via the charging pad apparatus 108. The user device 104 may be charged via a wireless or a wired connection.

The wireless charging system 100 may have or use a network 106 to communicate among different components of the wireless charging system 100, such as between the charging pad apparatus 108, the vehicle 102 and/or the user device 104. The network 106 may be a Dedicated Short-Range Communication (DSRC) network, a local area network (LAN), a wide area network (WAN), a cellular network, the Internet, or combination thereof, that connects, couples and/or otherwise communicates among the different components of the wireless charging system 100.

The wireless charging system 100 detects or measures various parameters of the user device 104, the environment of the vehicle 102 and/or the status of the charging pad apparatus 108 and manages the temperature of the user device 104 to operate the user device 104 within the optimal temperature range to obtain peak or maximum energy efficiency. When the user device 104 is either too cold or too hot, the user device 104 does not operate at peak energy efficiency, which increases the charging time and may cause discomfort and/or dissatisfaction to the user of the user device 104. The various parameters may include an ambient temperature of the surrounding environment, the temperature of the charging pad apparatus 108, the temperature of the user device 104, the resource load on the user device 104, and/or the state of charge of the battery of the user device 104. Each of these various parameters effect the temperature of the user device 104 when the user device 104 is charging.

In some implementations, the functions of detecting, measuring and managing the temperature of the user device 104 to maintain the user device 104 within the optimal temperature range may be implemented in a charging system using a wired connection to charge the user device 104. The user device 104 may not necessarily be positioned within a charging pad apparatus 108 but rather be directly connected to a power source, such as via a cable, and placed on a device pad that warms or cools the user device 104.

Figure 3:
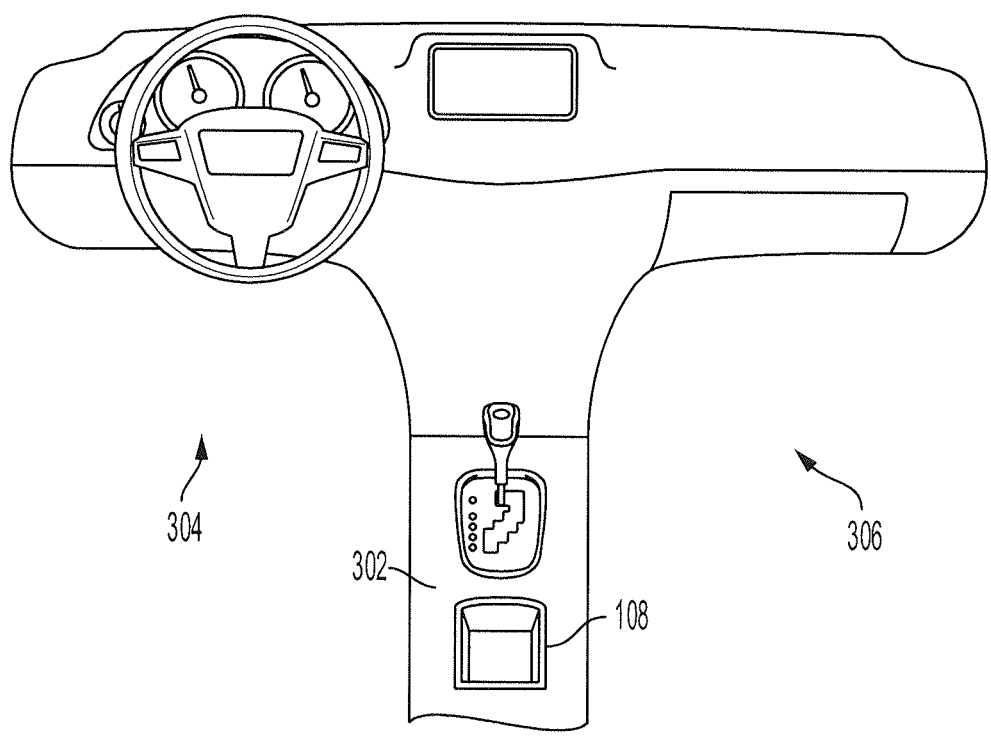
FIG. 3 shows the wireless charging system of FIG. 1 integrated within the dashboard of the vehicle according to an aspect of the invention.

The wireless charging system 100 may include or be retro-fitted or integrated with the vehicle 102. The charging pad apparatus 108 of the wireless charging system 100 may be positioned with an interior compartment of the vehicle 102, such as within a portion 302 of the dashboard equidistant in between the driver seat 304 and the passenger seat 306 to provide for easy access by the occupants of the vehicle 102 to charge a user device 104, as shown in FIG. 3, for example. The wireless charging system 100 may have or use components of the vehicle 102, such as the electronic control unit 110, the memory 112, the network access device 116 and/or the ambient temperature sensor 114, to communicate with the user device 104 via the network 106. The wireless charging system 100 may draw power from a power source, such as the battery 118 of the vehicle 102 and/or may have its own separate power source (not shown).

A vehicle 102 is a conveyance capable of transporting a person, an object, or a permanently or temporarily affixed apparatus. The vehicle 102 may be a self-propelled wheeled conveyance, such as a car, sports utility vehicle, truck, bus, van or other motor, battery or fuel cell driven vehicle. For example, the vehicle 102 may be an electric vehicle, a hybrid vehicle, a hydrogen fuel cell vehicle, a plug-in hybrid vehicle or any other type of vehicle that has a fuel cell stack, a motor and/or a generator. Other examples of vehicles include bicycles, trains, planes, or boats, and any other form of conveyance that is capable of transportation. The vehicle 102 may be semi-autonomous or autonomous. That is, the vehicle 102 may be self-maneuvering and navigate without human input. An autonomous vehicle may have and use one or more sensors and/or a navigation unit to drive autonomously.

Figure 2:
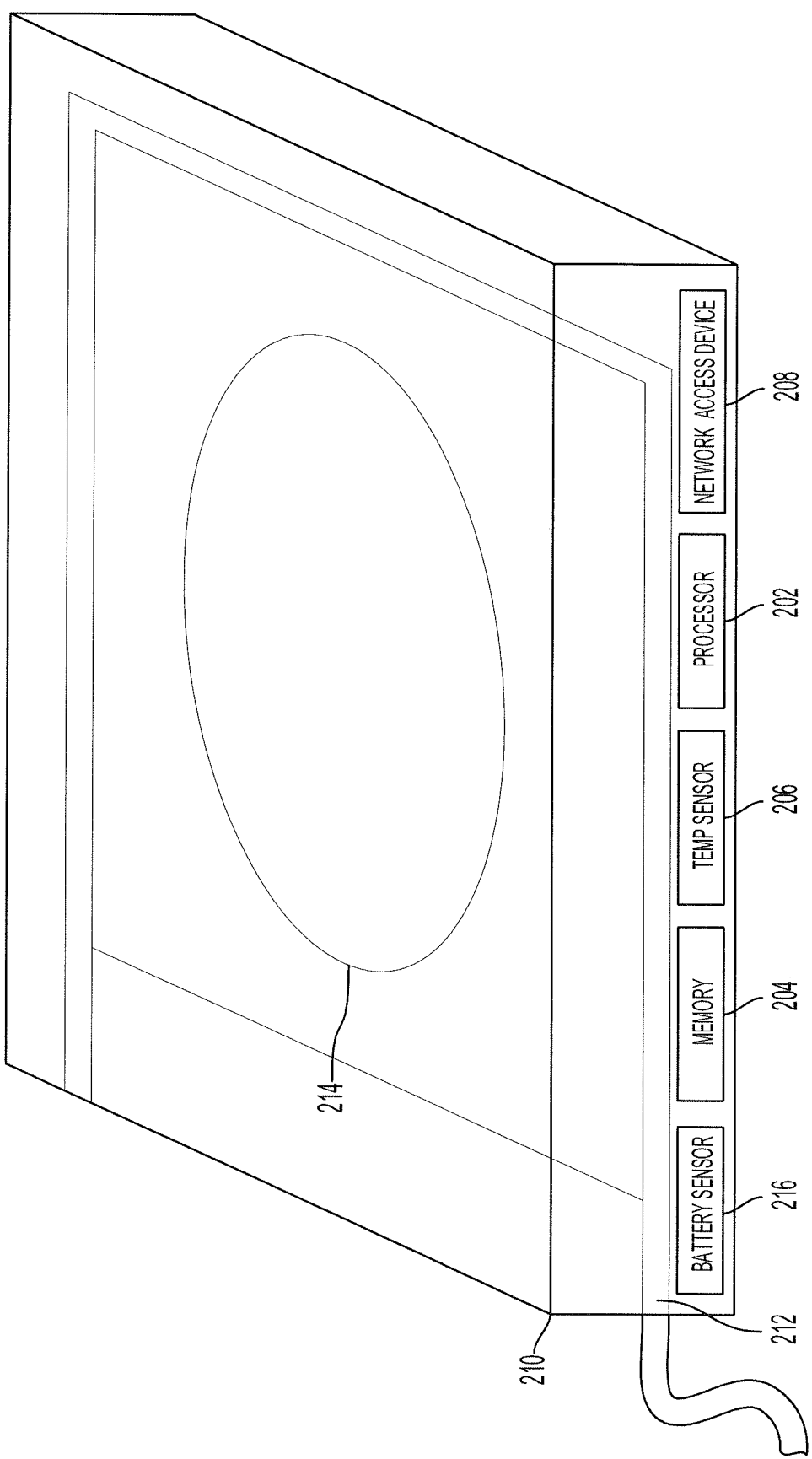
FIG. 2 shows the charging apparatus pad of the wireless charging system of FIG. 1 according to an aspect of the invention.

In some implementations, the wireless charging system 100 may have separate components enclosed within a charging pad apparatus 108, such as the processor 202, the memory 204, the battery sensor 216, the temperature sensor 206 and/or the network access device 208, as shown in FIG. 2, for example. The charging pad apparatus 108 may be mounted to the vehicle 102 and may communicate with the user device 104 to obtain various parameters and control the temperature of the user device 104. The charging pad apparatus 108 may have a wireless transmitter 214 that provides the wireless charge to the user device 104 when the user device 104 is placed on the charging pad apparatus 108 to wirelessly charge. The charging pad apparatus 108 may have a wireless charging pad or housing 210 that encloses and surrounds components of the charging pad apparatus 108, such as the wireless transmitter 214, the memory 204, the temperature sensor 206, the battery sensor 216, the processor 202 and/or the network access device 208. The wireless transmitter 214 may be positioned within a surface of the housing in close proximity to the user device 104 that is being charged. The housing 210 may also enclose and surround the thermoelectric device 212 or the thermoelectric device 212 may be mounted below or placed beneath the surface of the charging pad apparatus 108 to regulate the temperature of the charging pad apparatus 108.

The wireless charging system 100 includes or couples to one or more processors, such as the electronic control unit 110 or the processor 202, a memory 112, 204, one or more sensors, such as the ambient temperature sensor 114, the battery sensor 216 or the temperature sensor 206 and/or a network access device 116, 208 within the vehicle 102 and/or the charging pad apparatus 108. The wireless charging system 100 may include a user interface 120 and/or other vehicle components of the vehicle 102, such as a navigation unit 122, a motor and/or generator 124, an engine 126, a battery 118 and/or a battery management control unit 128. The wireless charging system 100 may not necessarily include the other vehicle components, but rather, may be coupled to the other vehicle components.

The ECU 110 and/or the processor 202 may be implemented as a single processor or as multiple processors. For example, the processor 202 may be a microprocessor, data processor, microcontroller or other controller, and may be electrically coupled to some or all the other components within the vehicles 102 and/or the charging pad apparatus 108. The ECU 110 and/or the processor 202 may adjust the amount or polarity of the electrical energy delivered through the thermoelectric device 212 to control, manage, adjust or otherwise change or maintain the temperature of a surface of the housing 210 to manage the temperature of the user device 104 placed on or within the surface of the housing 210. The ECU 110 may be coupled to the memory 112, and the processor 202 may be coupled to the memory 204.

The wireless charging system 100 has a memory 112, 204. The memory 112, 204 may be coupled to the ECU 110 or the processor 202, respectively, and store instructions that the ECU 110 or the processor 202 executes. The memory 112, 204 may include one or more of a Random Access Memory (RAM), Read Only Memory (ROM) or other volatile or non-volatile memory. The memory 112, 204 may be a non-transitory memory or a data storage device, such as a hard disk drive, a solid-state disk drive, a hybrid disk drive, or other appropriate data storage, and may further store machine-readable instructions, which may be loaded and executed by the ECU 110 or the processor 202, respectively. The memory 112, 204 may store one or more device settings, such as a minimum temperature threshold, a maximum temperature threshold and/or an optimal temperature range, for various types of user devices.

The wireless charging system 100 may include one or more sensors. The one or more sensors may include an ambient temperature sensor 114, a battery sensor 216 or a temperature sensor 206. The ambient temperature sensor 114 may detect or measure an ambient temperature of the environment within the passenger compartment of the vehicle 102a. The ambient temperature sensor 114 may be positioned within the vehicle 102 or may be mounted, included within or coupled to the charging pad apparatus 108. The battery sensor 216 may detect or measure a state of charge of the battery of the user device 104. The temperature sensor 206 may detect or measure a temperature of the user device 104 and/or a temperature of the surface of the housing 210 of the charging pad apparatus 108. Similarly, the battery sensor 216 and/or the temperature sensor 206 may be mounted to, included within or otherwise coupled to the charging pad apparatus 108 and/or may be positioned within the vehicle 102a. In some implementations, the one or more sensors may be on the user device 104, which may communicate the sensor data, such as the temperature of the ambient environment or user device 104 and/or the state of charge of the user device 104 to the charging pad apparatus 108.

The wireless charging system 100 includes a thermoelectric device 212. The thermoelectric device 212 may be a Peltier device. The thermoelectric device 212 may be positioned within the housing 210 and/or positioned below a surface of the charging pad apparatus 108. The thermoelectric device 212 may have a power source or be coupled to a power source, such as the electrical system or battery 118 of the vehicle 102. The ECU 110 and/or the processor 202 may control the thermoelectric device 212 to activate, control or otherwise change or adjust the temperature of the user device 104 and/or the surface of the housing 210. For example, the thermoelectric device 212 may use electricity to pull heat away from the charging surface to help create a cool zone. In another example, the thermoelectric device 212 may reverse the voltage polarity to warm the charging pad apparatus 108, which may be useful when charging in extreme cold environments as wireless device batteries have an optimal temperature range for charging.

The wireless charging system 100 may have a user interface 120 and/or a network access device 116, 208. The user interface 120 may receive user input that indicates a device profile, which indicates the type of user device 104 that is being charged. In some implementations, the wireless charging system 100 may automatically detect the type of user device 104 that is being charged when the user device 104 is connected to the charging pad apparatus 108. For example, the user interface 120 may receive user input, such as a user selection, which identifies the device type.

The user interface 120 may include an input/output device that receives user input from a user interface element, a button, a dial, a microphone, a keyboard, or a touch screen. The user interface 120 may provide an output to an output device, such as a display, a speaker, an audio and/or visual indicator, or a refreshable braille display. The output device may display an alert or notification that the charging pad apparatus 108 is charging the user device 104, the state of charge or temperature of the user device 104 and/or other relevant information related to the charging of the user device 104.

The network access devices 116, 208 may include a communication port or channel, such as one or more of a Dedicated Short-Range Communication (DSRC) unit, a Wi-Fi unit, a Bluetooth® unit, a radio frequency identification (RFID) tag or reader, or a cellular network unit for accessing a cellular network (such as 3G, 4G or 5G). The network access devices 116, 208 may transmit data to and receive data from the different components of the different entities of the wireless charging system 100, such as the user device 104, the charging pad apparatus 198 and/or the vehicle 102.

The one or more vehicle components may include a navigation unit 122. The navigation unit 122 may be integral to the vehicle 102 or a separate unit coupled to the vehicle 102. The vehicle 102 may include a Global Positioning System (GPS) unit (not shown) for detecting location data including a current location of the vehicle 102 and date/time information instead of the navigation unit 122. In that regard, the ECU 110 may perform the functions of the navigation unit 122 based on data received from the GPS unit. The navigation unit 122 or the ECU 110 may perform navigation functions. Navigation functions may include, for example, route and route set prediction, providing navigation instructions, and receiving user input such as verification of predicted routes and route sets or destinations.

The one or more vehicle components may include a motor and/or generator 124. The motor and/or generator 124 may convert electrical energy into mechanical power, such as torque, and may convert mechanical power into electrical energy. The motor and/or generator 124 may be coupled to the battery 118. The motor and/or generator 124 may convert the energy from the battery 118 into mechanical power, and may provide energy back to the battery 118, for example, via regenerative braking. The vehicle 102 may include one or more additional power generation devices such as the engine 126 or a fuel cell stack (not shown). The engine 126 combusts fuel to provide power instead of and/or in addition to the power supplied by the motor and/or generator 124.

The battery 118 may be coupled to the motor and/or generator 124 and may provide electrical energy to and receive electrical energy from the motor and/or generator 124. The battery 118 may include one or more rechargeable batteries and provide power to the charging pad apparatus 108.

The BMCU 128 may be coupled to the battery 118 and may control and manage the charging and discharging of the battery 118. The BMCU 128, for example, may measure, using battery sensors, parameters used to determine the state of charge (SOC) of the battery 118. The BMCU 128 may control the battery 118.

Figure 4:
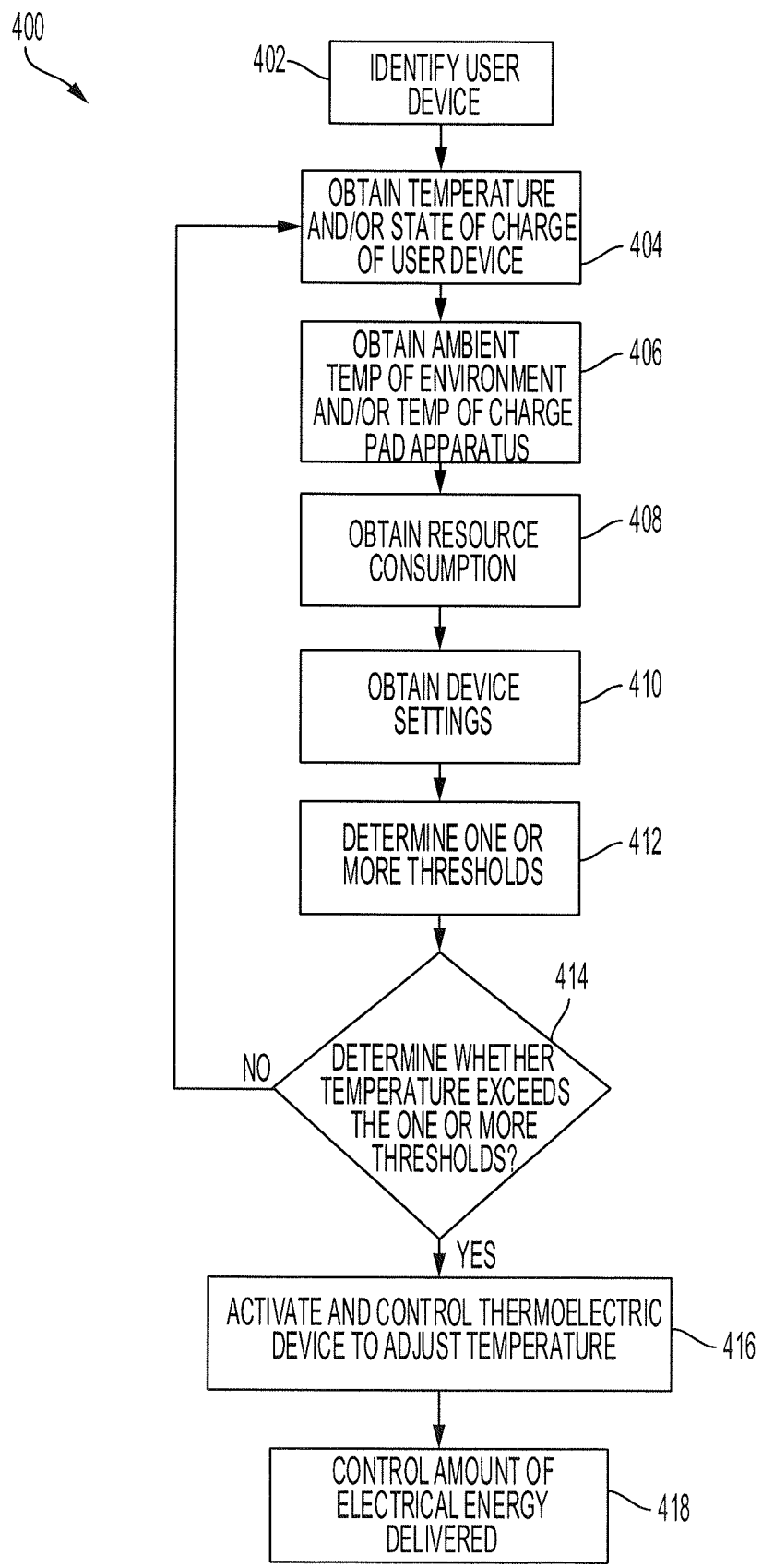
FIG. 4 is a flow diagram of an example process for activating the wireless charging system of FIG. 1 according to an aspect of the invention.

FIG. 4 is a flow diagram of a process 400 for activating the thermoelectric device 212 to control the temperature of the user device 104 that is being charged. One or more computers or one or more data processing apparatuses, for example, the ECU 110 and/or the processor 202 of the wireless charging system 100 of FIG. 1, appropriately programmed, may implement the process 400.

The wireless charging system 100 may identify the user device 104 (402). The wireless charging system 100 may receive user input from the user interface 120 to identify the type of user device 104 to be charged. For example, the user interface 120 may receive a user selection from a touch-screen display that identifies the type of user device 104 being connected or coupled for charging. In some implementations, the user device 104 may be paired with the charging pad apparatus 108 and based on the communication or power transfer protocol, the wireless charging system 100 may determine the type of user device 104 that is connected to be charged. Thus, the wireless charging system 100 may tailor the warming or cooling of the user device 104 to specific device requirements of the user device 104 to maximize wireless charging efficiency by maintaining the user device 104 within the optimal temperature range.

The wireless charging system 100 may obtain the temperature and/or state of charge of the user device 104 (404). The wireless charging system 100 may use the temperature sensor 206 and/or the battery sensor 216 to measure the temperature and/or the state of charge, respectively, of the user device 104. Once measured, the temperature and/or the state of charge may be provided to the processor 202 and/or the ECU 110 to be used to determine whether to activate the thermoelectric device 212. In some implementations, the user device 104 communicates with and the ECU 110 and/or the processor 202 receives the temperature of the user device 104 and/or the state of charge of the user device 104 from the user device 104 via the network access device 116, 208.

The wireless charging system 100 may obtain the ambient temperature of the environment and/or the temperature of the charging pad apparatus 108 (406). The wireless charging system 100 may obtain the ambient temperature of the environment within the passenger compartment of the vehicle 102 and in proximity to the charging pad apparatus 108. The ambient temperature and/or the temperature of the charging pad apparatus 108 may affect the user device 104 and/or rate of cooling or heating of the user device 104, and so, the wireless charging system 100 may use the measured temperatures as factors when adjusting or controlling the thermoelectric device 212 to increase or decrease the temperature of the user device 104.

The wireless charging system 100 may obtain the amount of resource consumption or processing power that is being used by the user device 104 (408). The charging pad apparatus 108 may receive from the user device 104 statistics that indicate the resource consumption of the user device 104. The wireless charging system 100 may factor in the amount of resource consumption or processing power that is being used when adjusting the temperature of the user device 104 because resource consumption and processing contributes to electrical energy use and the temperature of the user device 104.

The wireless charging system 100 may obtain one or more device settings (410). The one or more device settings set the optimal temperature range of the particular user device 104 that is being charged, e.g., the one or more thresholds that define the optimal temperature range. The optimal temperature range is the temperature range where the user device 104 operates most efficiently and defines a minimum temperature and a maximum temperature.

The wireless charging system 100 may obtain the one or more device settings from the memory 112, 204 based on the type of device. The wireless charging system 100 may store multiple device settings in the memory 112, 204 and associate the type of user device identified with one or more corresponding device settings. Since each user device 104 may have a different optimal temperature range, the wireless charging system 100 is able to adjust and cool or warm the user device 104 for optimal charging and device management, i.e., keeping the user device at a safe temperature.

Once the one or device settings are obtained, the wireless charging system 100 determines the one or more thresholds for the user device 104 based on the one or more device settings (412). The wireless charging system 100 uses the one or more device settings to define the one or more thresholds, such as a minimum temperature threshold and a maximum temperature threshold, which the user device 104 operates within to adjust the temperature of the user device 104 accordingly. Since the device settings are different for various user devices, the one or more thresholds may be different for different types of user devices 104. For example, the one or more device settings may indicate an optimal temperature range having a minimum temperature threshold of approximately 55 degrees Fahrenheit and a maximum temperature threshold of approximately 75 degrees Fahrenheit.

The wireless charging system 100 determines whether the temperature of the user device 104 exceeds the one or more thresholds (414). When the temperature of the user device 104 exceeds the one or more thresholds, the energy transfer to the user device 104 is suboptimal. For example, when the user device 104 is too hot, electrical energy is lost in the transfer due to heat and the components of the user device 104 and/or charging pad apparatus 108 may overheat or become damaged. Moreover, the user device 104 may be too hot to touch, which may cause user discomfort and/or dissatisfaction. In another example, when the temperature of the user device 104 is too cold, electrical energy may be used to warm the user device 104 instead of to charge the user device 104, and so, charging of the user device 104 may take longer.

If the temperature of the user device 104 does not exceed the one or more thresholds, the wireless charging system 100 continues to monitor the temperature of the user device 104 (404). If the temperature of the user device 104 does exceed the one or more thresholds, the wireless charging system 100 activates and controls the thermoelectric device 212 to control, adjust or otherwise maintain the temperature of the user device 104 within the optimal temperature range (416).

The wireless charging system 100 may control the amount of electrical energy delivered, the rate of delivery, and the polarity of the electrical energy delivered through the thermoelectric device 212 to control an amount of temperature increase or decrease of the surface of the housing 210, and subsequently, the user device 104. Delivering electrical energy through the thermoelectric device 212 creates a cool zone or a warm zone that cools or warms the user device 104.

The thermoelectric device 212 may use electricity to pull heat away from the charging surface to help create a cool zone. Be reversing the voltage polarity, the thermoelectric device 212 may warm the charging surface of the charging pad apparatus 108. The thermo-electric device may be variably adjusted to create various temperature cool or warm zones. When a cool zone is formed, the heat from the user device 104 is transferred to the underside of the thermoelectric device 212 and is drawn away from the user device 104. The cool zone then allows the user device 104 to be charged at higher power levels without overheating or creating a thermal shut down. Conversely, if the surface of the charging pad apparatus 108 needs to be warmed for optimal charging, the thermoelectric device 212 would heat the surface.

The control, the polarity, the rate and the amount may be based on various factors. The various factors include the temperature of the user device 104, the ambient temperature, the amount of resource consumption occurring in the user device 104, the temperature of the user device 104 and/or the charging pad apparatus 108, and/or the state of charge of the user device 104. Each factor affects the amount of heat generated or surrounding the user device 104, which effects the existing heat and rate of change of the temperature of the user device 104. The control and activation of the thermoelectric device 212 may continue until the temperature of the user device 104 is within the optimal temperature range so that the wireless charging system 100 may continue to provide the most efficient electrical charge to the user device 104.

For example, when the ambient temperature surrounding the user device 104 is warmer or hotter than the temperature of the user device 104, there may be naturally occurring warmth of heat that facilitates the increase in temperature of the user device 104. And so, the wireless charging system 100 may restrict the rate and amount of the increase in temperature so that the temperature of the user device 104 increases gradually and in a controlled manner to obtain a fairly constant temperature within the optimal temperature range. Similarly, when the ambient temperature surrounding the user device is cooler or colder, there may be naturally occurring cooling that facilitates the decrease in temperature of the user device 104. And so, the rate and amount of decrease may be facilitated accordingly to achieve the fairly constant temperature.

Figure 5:
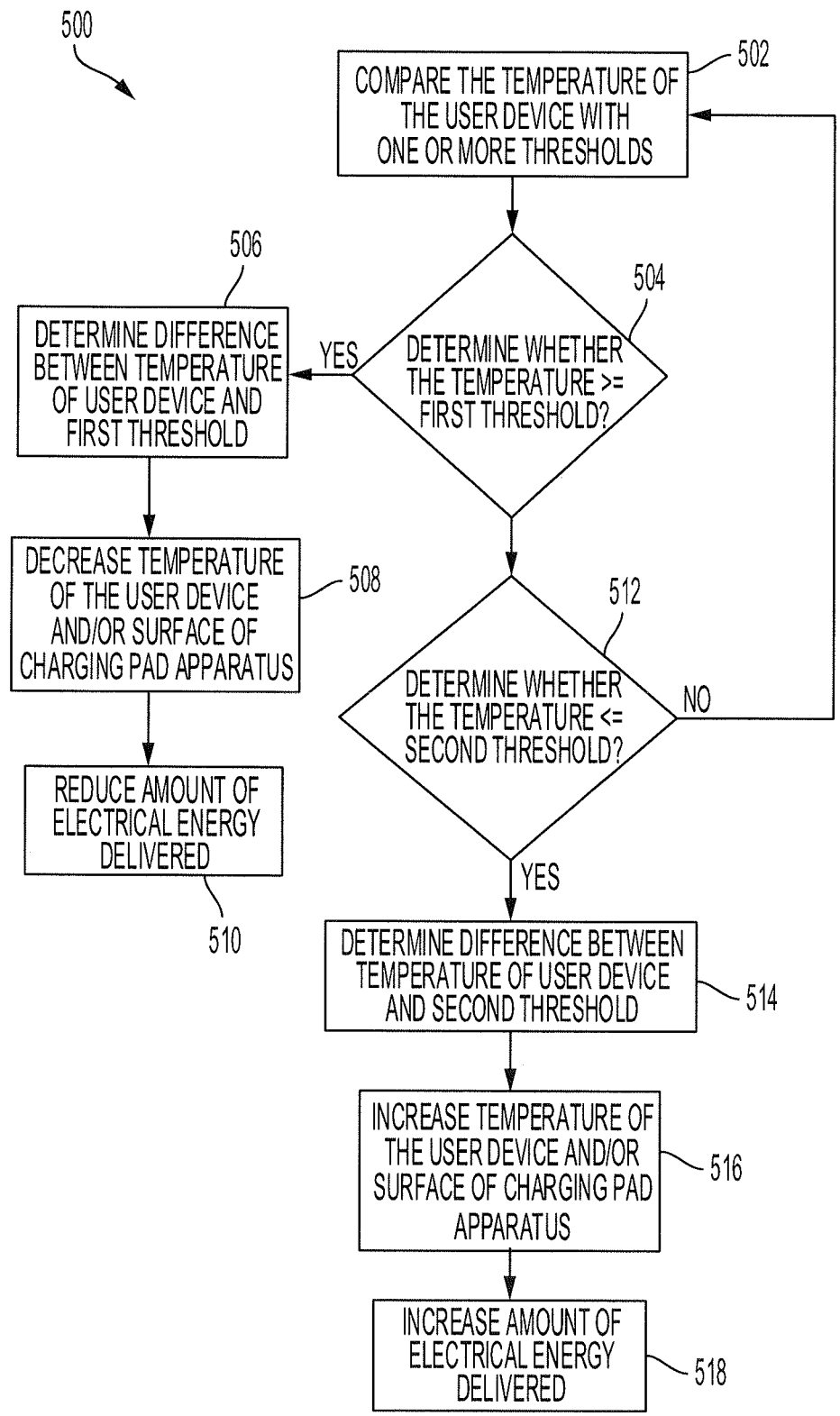
FIG. 5 is a flow diagram of an example process for controlling the thermoelectric device of the wireless charging system of FIG. 1 according to an aspect of the invention.

In another example, as the resource consumption increases, the user device 104 generates heat that facilitates the increase in temperature of the user device 104. In another example, when the battery of the user device 104 is nearly full, the wireless charging system 100 may not activate the thermoelectric device 212, but instead, shutoff charging of the user device 104 because the user device 104 does not need to be charged. In some implementations, the user may want the user device 104 to be warmed even when the user device 104 is fully charged to minimize discomfort when the ambient temperature is cold or below a threshold temperature. And thus, the wireless charging system 100 may operate differently based on a combination of the ambient temperature, a user configuration setting and/or the state of charge of the user device 104. FIG. 5 further describes the various thresholds and adjustments that the wireless charging system 100 employs to maintain the user device 104 at a fairly constant and optimal temperature of wireless charging.

In some implementations, the wireless charging system 100 may also adjust or control the amount of electrical energy delivered to the user device 104 for charging based on the temperature of the user device 104 (418). The wireless charging system 100 may operate the wireless transmitter 214 to deliver a varying amount of electrical energy. When the temperature of the user device 104 is above a high threshold temperature, the wireless charging system 100 may lower the amount of power delivered to the user device 104 or shutoff the power to the user device 104 to reduce the temperature of the user device 104. This may prevent the user device 104 from overheating. Similarly, when the temperature of the user device 104 is below a low threshold temperature, the wireless charging system 100 may increase the amount of power delivered to the user device 104 to increase the temperature of the user device 104. Ideally, the wireless charging system 100 delivers the electrical energy at peak efficiency but controlling the amount of power delivered adds an additional layer protection for the user device 104.

FIG. 5 is a flow diagram of a process 500 for controlling the thermoelectric device 212 to increase or decrease the temperature of the user device 104 that is being charged. One or more computers or one or more data processing apparatuses, for example, the ECU 110 and/or the processor 202 of the wireless charging system 100 of FIG. 1, appropriately programmed, may implement the process 500.

The wireless charging system 100 may compare the temperature of the user device with one or more thresholds defined by the one or more device settings (502). The wireless charging system 100 compares the temperature of the user device 104 with the one or more thresholds to determine whether the user device 104 is within an optimal temperature range as defined by the one or more device settings, such as within a minimum temperature threshold and a maximum temperature threshold. This is to maintain the user device 104 at a fairly constant temperature to operate at peak efficiency.

The wireless charging system 100 determines whether the temperature of the user device 104 is greater than or equal to a first threshold (504). The determination is based on the comparison of the temperature of the user device 104 and the first threshold. The first threshold is based on the one or more device settings and may be a maximum temperature threshold of the optimal temperature range for the user device 104. If the temperature of the user device 104 is less than the first threshold, the wireless charging system 100 determines whether the temperature of the user device 104 is less than or equal to a second threshold (512). If the temperature of the user device 104 is greater than or equal to the first threshold, the wireless charging system 100 may determine a difference between the temperature of the user device 104 and the first threshold (506). The wireless charging system 100 may calculate the difference and use the difference to determine an amount to decrease the temperature of the user device 104.

The wireless charging system 100 decreases the temperature of the user device 104 and/or a surface of the charging pad apparatus 108 (508). The amount that the wireless charging system 100 decreases the temperature of the user device 104 may be based on the difference in temperature between the temperature of the user device 104 and the first threshold. The wireless charging system 100 may decrease the temperature of the user device 104 until the temperature of the user device 104 is below the first threshold and within the optimal temperature range, such as between about 55 degrees Fahrenheit and 75 degrees Fahrenheit.

The wireless charging system 100 may control the voltage applied to the thermoelectric device to create a difference in temperature build up between two semiconductors that form the thermoelectric device 212. This creates one side which acts as a cooling plate that absorbs heat which is transported by the semiconductor to the other side of the thermoelectric device and forms a cool zone near the surface of the charging pad apparatus 108, which cools or decreases the temperature of the surface of the charging pad apparatus 108 and/or the user device 104.

The amount to decrease the temperature of the user device 104 may be based on the state of charge of the battery, the ambient temperature and/or the resource consumption of the user device 104. The amount to decrease the temperature of the user device 104 may be directly proportional or correlated with the ambient temperature, the resource consumption and/or the state of charge of the battery. Since a higher ambient temperature, resource consumption and/or state of charge of the battery results in a greater or increased temperature for the user device 104 than normal, the user device 104 must be cooled to a greater degree so that the temperature of the user device 104 is within the optimal temperature range. Thus, the amount necessary to decrease the temperature of the user device 104 to the optimal temperature range and below the first threshold will be greater.

When the difference between the temperature and the first threshold exceeds a safety margin, such as when the user device 104 is very hot, e.g., greater than approximately 80° F., the wireless charging system 100 may reduce the amount of electrical energy delivered to the user device 104 (510). The wireless charging system 100 may reduce the amount of electrical energy transmitted through the wireless transmitter 214 to charge the user device 104 when the difference in temperature exceeds the safety margin. For example, the wireless charging system 100 may decrease the power output from 15 W to 10 W or 5 W. In another example, the wireless charging system 100 may shutoff the power output. This prevents the user device 104 from overheating and/or damaging the components of the user device 104.

When the wireless charging system 100 determines that the temperature of the user device 104 is less than the first threshold, the wireless charging system 100 may determine whether the temperature is less than or equal to a second threshold, such as the minimum temperature threshold (512). The determination is based on the comparison between the temperature of the user device 104 and the second threshold. The second threshold is based on the one or more device settings and may be a minimum temperature threshold of the optimal temperature range for the user device 104.

If the temperature of the user device 104 is greater than the second threshold, the wireless charging system 100 is within the optimal temperature range and may continue to compare the temperature of the user device 104 and the one or more thresholds. If the temperature of the user device 104 is less than or equal to the second threshold, the wireless charging system 100 may determine a difference between the temperature of the user device 104 and the second threshold (514). The wireless charging system 100 may calculate the difference and use the difference to determine an amount to increase the temperature of the user device 104.

The wireless charging system 100 increases the temperature of the user device 104 and/or a surface of the charging pad apparatus 108 (516). The amount that the wireless charging system 100 increases the temperature of the user device 104 may be based on the difference in temperature between the temperature of the user device 104 and the second threshold. The wireless charging system 100 may increase the temperature of the user device 104 until the temperature of the user device 104 is above the second threshold and within the optimal temperature range.

The wireless charging system 100 may reverse the polarity of the voltage applied to the thermoelectric device to create a difference in temperature build up between the two semiconductors that form the thermoelectric device 212. This creates a warming effect on the side of the thermoelectric device, which warms or increases the temperature of the surface of the charging pad apparatus 108 and/or the user device. This may be useful in cold environments, e.g., when the ambient temperature is below a threshold amount, to warm the user device 104 and allow the user device 104 to operate in the optimal temperature range.

The amount to increase the temperature of the user device 104 may be based on the state of charge of the battery, the ambient temperature and/or the resource consumption of the user device 104. The amount to increase the temperature of the user device 104 may be indirectly proportional or correlated with the ambient temperature, the resource consumption and/or the state of charge of the battery. Since a lower ambient temperature, resource consumption and/or state of charge of the battery results in a lesser or decreased temperature for the user device 104 than normal, the user device 104 must be warmed to a greater degree so that the temperature of the user device 104 is within the optimal temperature range. Thus, the amount necessary to increase the temperature of the user device 104 to the optimal temperature range and above the second threshold will be greater than when these factors are higher or in greater demand.

When the difference between the temperature and the second threshold exceeds an operating margin, such as when the user device 104 is very cool, e.g., at approximately 50 degrees Fahrenheit, the wireless charging system 100 may increase the amount of electrical energy delivered to the user device 104 (518). The wireless charging system 100 may increase the amount of electrical energy transmitted through the wireless transmitter 214 to charge the user device 104 when the difference in temperature exceeds the operating margin. For example, the wireless charging system 100 may increase the power output from 5 W to 10 W or 15 W. This prevents the user device 104 from working sub-optimally when the temperature is very cold.

The amount to increase or decrease the temperature of the user device 104 may directly correspond with the difference between the temperature of the user device 104 and the one or more thresholds. As the difference increases, the amount of current that is drawn increases to warm or cool the user device 104 and/or the surface of the charging pad apparatus 108 to a greater degree or at a greater rate. Similarly, as the difference decreases, the amount of current that is drawn decreases to warm or cool the user device 104 and/or the surface of the charging pad apparatus 108 to a lesser degree or at a lesser rate.

Figure 6:
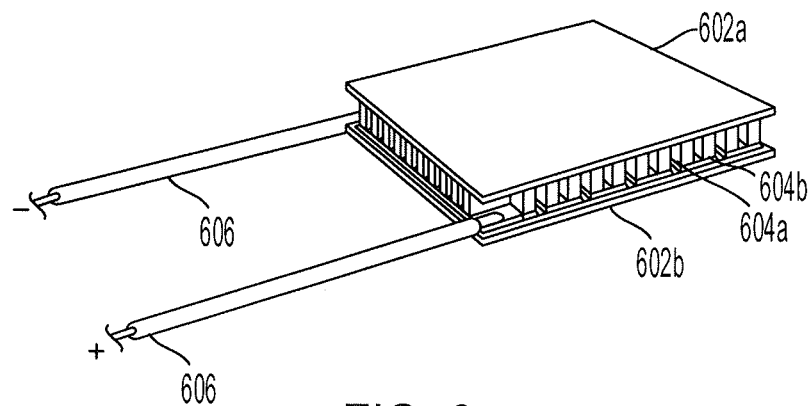
FIG. 6 shows an example thermoelectric device of the wireless charging system of FIG. 1 according to an aspect of the invention.

FIG. 6 shows the thermoelectric device 212 which may be enclosed within the housing 210 of the charging pad apparatus 108 or be positioned below a surface of the charging pad apparatus 108. The thermoelectric device 212 may have a top layer of substrate 602*a*, a bottom layer substrate 602*b*, a first semiconductor 604*a*, a second semiconductor 604*b* and one or more wire leads 606. The first semiconductor 604*a* and the second semiconductor 604*b* may be positioned within the top and bottom layers of the substrates 602*a-b*. The top and bottom layers of substrates 602*a-b* may be made from aluminum or ceramic, are thermally conductive and provide heat distribution or dissipation on the top or bottom sides, respectively. The first semiconductor 604*a* may be a p-type or n-type semiconductor pellet and the second semiconductor 604*b* may be the other of the p-type or n-type semiconductor pellet or pillar. The semiconductor pellet or pillars may alternate between p-type and n-type semiconductors. The one or more wire leads 606 receive an electrical charge from the power source 702, such as the battery 118, and provide the electrical charge through the two semiconductors 604*a-b* to create a cooling or a warming effect on the layers of the aluminum or ceramic substrates 602*a-b*.

Figure 7:
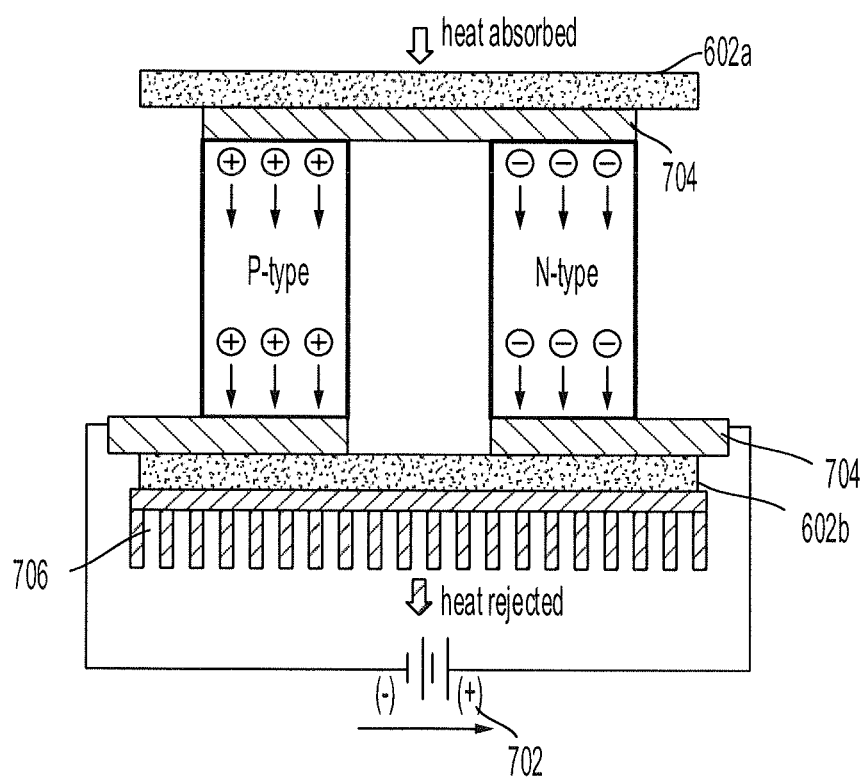
FIG. 7 shows an example schematic of the thermoelectric device of FIG. 6 according to an aspect of the invention.

The power source 702 may provide a current through one or more copper conductors 704 which applies voltage across the free ends of the two semiconductors across the junction of the device causing a temperature difference, as shown in FIG. 7, for example. On one side, such as the top layer of substrate 602*a*, a cooling zone may be created that absorbs heat which is then transported by the semiconductor 604*a-b* to the other side, such as the bottom layer of substrate 602*b*. The cooling may be proportional to the total cross section of all the pellets or pillars. The heat sink 706 may perform heat rejection and remove the heat from the thermoelectric device 212 into the air or other liquid or gas. This provides a cooling effect on the surface of the charging pad apparatus 108. When the voltage polarity is reversed, a warming effect may occur on the surface of the charging pad apparatus 108 where the heat is rejected through the top layer of the substrate 602*a*.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A wireless charger for charging an electronic device within a vehicle, comprising:
   a first sensor configured to measure or detect a temperature of the electronic device to be charged;
   a memory configured to store data relating to settings or requirements based on device type of a plurality of devices, the data including a first threshold temperature associated with the electronic device;
   a thermoelectric device configured to adjust the temperature of the electronic device or a temperature of a surface of a charging pad; and
   a processor coupled to the first sensor, the memory, and the thermoelectric device and configured to:
      determine that the temperature of the electronic device exceeds the first threshold temperature, and
      control the thermoelectric device to increase or decrease the temperature of the electronic device or the temperature of the surface of the charging pad.

2. The wireless charger of claim 1, wherein the determination that the temperature of the electronic device exceeds the first threshold temperature comprises a determination that the temperature of the electronic device is greater than or equal to the first threshold temperature.

3. The wireless charger of claim 2, wherein the controlling of the thermoelectric device to increase or decrease the temperature of the electronic device or the temperature of the surface of the charging pad comprises controlling of the thermoelectric device to decrease the temperature of the electronic device or the temperature of the surface of the charging pad when the temperature of the electronic device is greater than or equal to the first threshold temperature.

4. The wireless charger of claim 1, wherein the determination that the temperature of the electronic device exceeds the first threshold temperature comprises a determination that the temperature of the electronic device is less than the first threshold temperature.

5. The wireless charger of claim 4, wherein the controlling of the thermoelectric device to increase or decrease the temperature of the electronic device or the temperature of the surface of the charging pad comprises controlling of the thermoelectric device to increase the temperature of the electronic device or the temperature of the surface of the charging pad when the temperature of the electronic device is less than the first threshold temperature.

6. The wireless charger of claim 1, wherein the controlling of the thermoelectric device to increase or decrease the temperature of the electronic device or the temperature of the surface of the charging pad comprises controlling of the thermoelectric device to:
   decrease the temperature of the electronic device or the temperature of the surface of the charging pad when the temperature of the electronic device is greater than or equal to the first threshold temperature; and
   increase the temperature of the electronic device or the temperature of the surface of the charging pad when the temperature of the electronic device is less than a second threshold temperature lower than the first threshold temperature.

7. The wireless charger of claim 1, further comprising:
a second sensor configured to measure or detect an ambient temperature within the vehicle;
wherein the processor is further configured to:
control the thermoelectric device to increase or decrease the temperature of the electronic device or the temperature of the surface of the charging pad based on the ambient temperature and the temperature of the electronic device.

8. The wireless charger of claim 1, wherein the processor is further configured to control the thermoelectric device to increase or decrease the temperature of the electronic device or the temperature of the surface of the charging pad until the temperature of the electronic device no longer exceeds the first threshold temperature.

9. A charging apparatus, comprising:
a temperature sensor configured to measure or detect a temperature of an electronic device that is to be charged;
a battery sensor configured to measure or detect a state of charge of a battery of the electronic device;
a thermoelectric device configured to adjust the temperature of the electronic device; and
a processor coupled to the temperature sensor, the battery sensor, and the thermoelectric device and configured to:
determine that the temperature of the electronic device exceeds a temperature range,
cause the thermoelectric device to increase the temperature of the electronic device when the temperature of the electronic device is below the temperature range,
cause the thermoelectric device to decrease the temperature of the electronic device when the temperature of the electronic device is above the temperature range,
determine the state of charge of the battery of the electronic device, and
cause the thermoelectric device to deactivate when the state of charge of the battery of the electronic device is greater than or equal to a threshold amount.

10. The charging apparatus of claim 9, wherein the temperature range has a minimum temperature and a maximum temperature, wherein the processor is further configured to:
determine a first difference between the temperature of the electronic device and the minimum temperature when the temperature of the electronic device is less than the minimum temperature; and
determine a second difference between the temperature of the electronic device and the maximum temperature when the when the temperature of the electronic device is greater than the maximum temperature.

11. The charging apparatus of claim 10, wherein the processor is further configured to:
cause the thermoelectric device to increase the temperature of the electronic device based on the first difference; and
cause the thermoelectric device to decrease the temperature of the electronic device based on the second difference.

12. The charging apparatus of claim 9, further comprising:
a housing that encloses the temperature sensor, the processor, the battery sensor, and the thermoelectric device and is coupled to a power source within a vehicle that provides power to the thermoelectric device.

13. The charging apparatus of claim 12, wherein the thermoelectric device is a Peltier device configured to use electricity to cool a surface of the housing to decrease the temperature of the electronic device or to warm the surface of the housing to increase the temperature of the electronic device.

14. The charging apparatus of claim 13, wherein the Peltier device changes or reverses a polarity of the electricity to either cool or warm the surface of the housing.

15. The charging apparatus of claim 9, wherein the processor is further configured to:
cause the thermoelectric device to deactivate when the temperature of the electronic device is within the temperature range.

16. A method for adjusting a temperature of a device to be charged within a vehicle, comprising:
measuring or detecting, by a temperature sensor, the temperature of the device to be charged;
determining, by a processor and based on data (i) relating to settings or requirements based on device type of a plurality of devices and (ii) including a first threshold temperature associated with the device to be charged, a predetermined temperature range associated with the device to be charged defined by a first threshold temperature;
determining, by the processor, that the temperature of the device to be charged is greater than the first threshold temperature; and
decreasing, by the processor and using a thermoelectric device, the temperature of the device to be charged in response to the temperature of the device to be charged being greater than the first threshold temperature.

17. The method of claim 16, further comprising:
determining, by the processor, that the temperature of the device to be charged is less than a second threshold temperature; and
increasing, by the processor and using the thermoelectric device, the temperature of the device to be charged in response to the temperature of the device to be charged being less than the second threshold temperature.

18. The method of claim 17, further comprising:
deactivating, by the processor, the thermoelectric device in response to the temperature of the device to be charged being greater than the second threshold temperature and less than the first threshold temperature.

19. The method of claim 17, wherein the second threshold temperature is less than the first threshold temperature.

20. The method of claim 17, further comprising:
obtaining, by the processor, an ambient temperature within the vehicle;
wherein the decreasing or the increasing of the temperature of the device to be charged is based on the ambient temperature within the vehicle.

* * * * *